United States Patent
Abe et al.

(10) Patent No.: US 8,148,890 B2
(45) Date of Patent: Apr. 3, 2012

(54) LIGHT-EMITTING DEVICE AND METHOD FOR MANUFACTURING THE SAME

(75) Inventors: Saori Abe, Tokyo (JP); Toshiyuki Oka, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 649 days.

(21) Appl. No.: 12/195,536

(22) Filed: Aug. 21, 2008

(65) Prior Publication Data
US 2009/0052159 A1    Feb. 26, 2009

(30) Foreign Application Priority Data
Aug. 22, 2007   (JP) ................. 2007-216034

(51) Int. Cl.
*H01L 27/15*   (2006.01)
*H01L 33/00*   (2010.01)
*H01L 33/02*   (2010.01)
*H01L 33/04*   (2010.01)

(52) U.S. Cl. ........ 313/502; 313/508; 313/503; 313/506; 313/509; 313/512; 362/84

(58) Field of Classification Search .......... 313/498–512; 362/84
See application file for complete search history.

(56) References Cited

U.S. PATENT DOCUMENTS

| | | | |
|---|---|---|---|
| 7,759,861 B2 * | 7/2010 | Fujimoto et al. | 313/506 |
| 7,955,531 B1 * | 6/2011 | Khanarian | 264/1.7 |
| 2003/0062530 A1 * | 4/2003 | Okazaki et al. | 257/79 |
| 2005/0093008 A1 * | 5/2005 | Suehiro et al. | 257/98 |
| 2006/0083281 A1 * | 4/2006 | Inoguchi | 372/50.12 |
| 2007/0023763 A1 * | 2/2007 | Takigawa et al. | 257/79 |
| 2007/0063214 A1 * | 3/2007 | Kim et al. | 257/99 |
| 2007/0085093 A1 * | 4/2007 | Ohmae et al. | 257/89 |
| 2007/0096113 A1 * | 5/2007 | Inoshita et al. | 257/79 |
| 2007/0108462 A1 * | 5/2007 | Park et al. | 257/98 |
| 2007/0114514 A1 * | 5/2007 | Ito | 257/13 |
| 2007/0212802 A1 * | 9/2007 | Lee et al. | 438/22 |
| 2007/0257269 A1 * | 11/2007 | Cho et al. | 257/95 |
| 2007/0295981 A1 * | 12/2007 | Erchak et al. | 257/98 |
| 2008/0142823 A1 * | 6/2008 | Moon et al. | 257/98 |
| 2008/0149916 A1 * | 6/2008 | Baba et al. | 257/13 |
| 2008/0173887 A1 * | 7/2008 | Baba et al. | 257/98 |
| 2008/0199653 A1 * | 8/2008 | Kuo et al. | 428/98 |

(Continued)

FOREIGN PATENT DOCUMENTS
JP     2003-23176    1/2003

(Continued)

OTHER PUBLICATIONS

Machine translation DO KR 10-2006-0046707 A1.pdf.*

(Continued)

*Primary Examiner* — Nimeshkumar Patel
*Assistant Examiner* — Jose M Diaz
(74) *Attorney, Agent, or Firm* — Oblon, Spivak, McClelland, Maier & Neustadt, L.L.P.

(57) ABSTRACT

A light-emitting device includes a support substrate which includes a light-emitting layer and a light extraction surface, and a light transmission layer, formed on the light extraction surface of the support substrate, having a periodic refractive index distribution structure in an in-plane direction and a thickness direction, the light transmission layer including a plurality of projections formed of a having a refractive index lower than that of the support substrate.

12 Claims, 8 Drawing Sheets

U.S. PATENT DOCUMENTS

| | | | |
|---|---|---|---|
| 2008/0217639 A1* | 9/2008 | Kim et al. | 257/98 |
| 2008/0258160 A1* | 10/2008 | Do | 257/98 |
| 2008/0258161 A1* | 10/2008 | Edmond et al. | 257/98 |
| 2008/0284313 A1* | 11/2008 | Berben et al. | 313/501 |
| 2008/0303018 A1* | 12/2008 | Kim et al. | 257/13 |
| 2009/0001398 A1* | 1/2009 | Song et al. | 257/98 |
| 2009/0020772 A1* | 1/2009 | Chiu et al. | 257/98 |
| 2009/0039365 A1* | 2/2009 | Andrews et al. | 257/98 |
| 2009/0127567 A1* | 5/2009 | Wang | 257/79 |
| 2009/0159908 A1* | 6/2009 | David et al. | 257/95 |
| 2009/0184334 A1* | 7/2009 | Lee et al. | 257/98 |
| 2009/0267092 A1* | 10/2009 | Fukshima et al. | 257/98 |
| 2009/0278145 A1* | 11/2009 | Sakai | 257/98 |
| 2009/0278149 A1* | 11/2009 | Chang | 257/98 |
| 2009/0315013 A1* | 12/2009 | Tansu et al. | 257/13 |
| 2010/0038665 A1* | 2/2010 | Sugiura et al. | 257/98 |
| 2010/0133658 A1* | 6/2010 | Dadgar et al. | 257/615 |
| 2010/0243033 A1* | 9/2010 | Brouwer et al. | 136/246 |
| 2010/0314647 A1* | 12/2010 | Won et al. | 257/98 |

FOREIGN PATENT DOCUMENTS

| | | |
|---|---|---|
| JP | 2003-258296 | 9/2003 |
| JP | 2005-191219 | 7/2005 |
| JP | 2006-222288 | 8/2006 |
| JP | 2006-278751 | 10/2006 |
| JP | 2006-324672 | 11/2006 |
| JP | 2007-184313 | 7/2007 |
| WO | WO 2006011734 A1 * | 2/2006 |
| WO | WO 2006103933 A1 * | 10/2006 |

OTHER PUBLICATIONS

U.S. Appl. No. 13/220,059, filed Aug. 29, 2011, Sugiyama, et al.

* cited by examiner

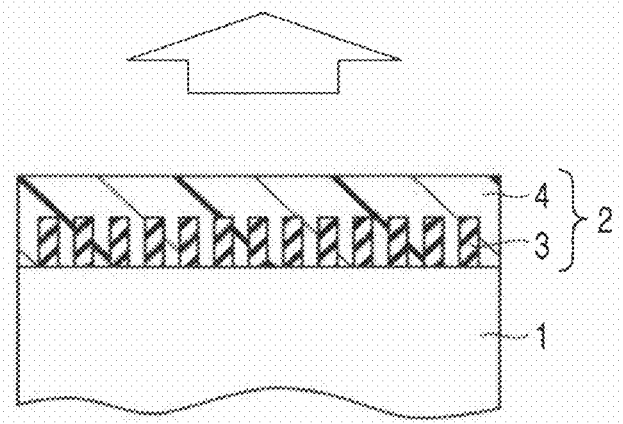
F I G. 1
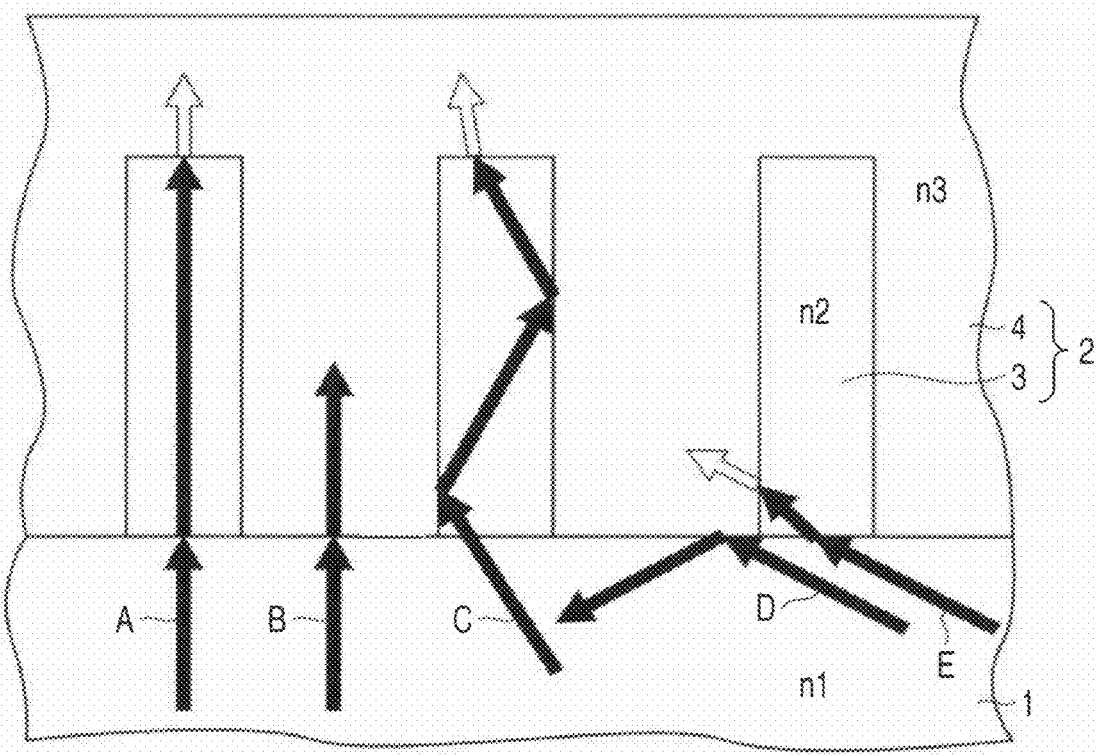
F I G. 2

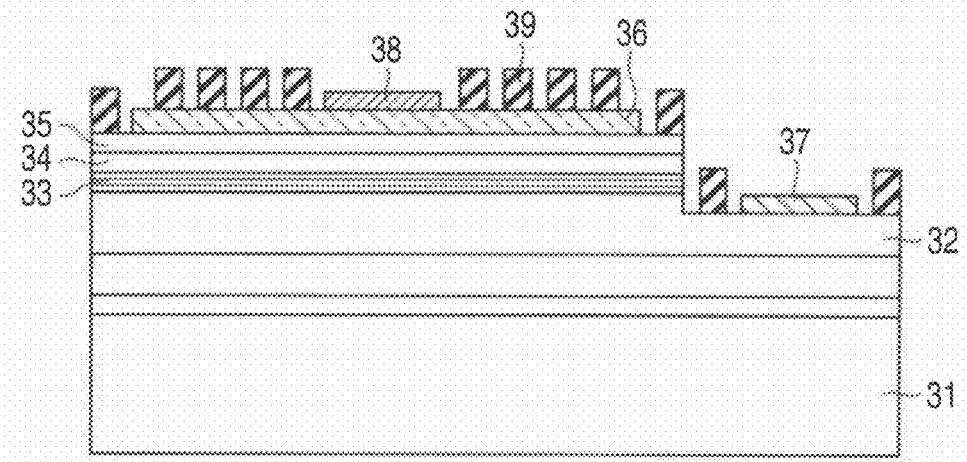
F I G. 13
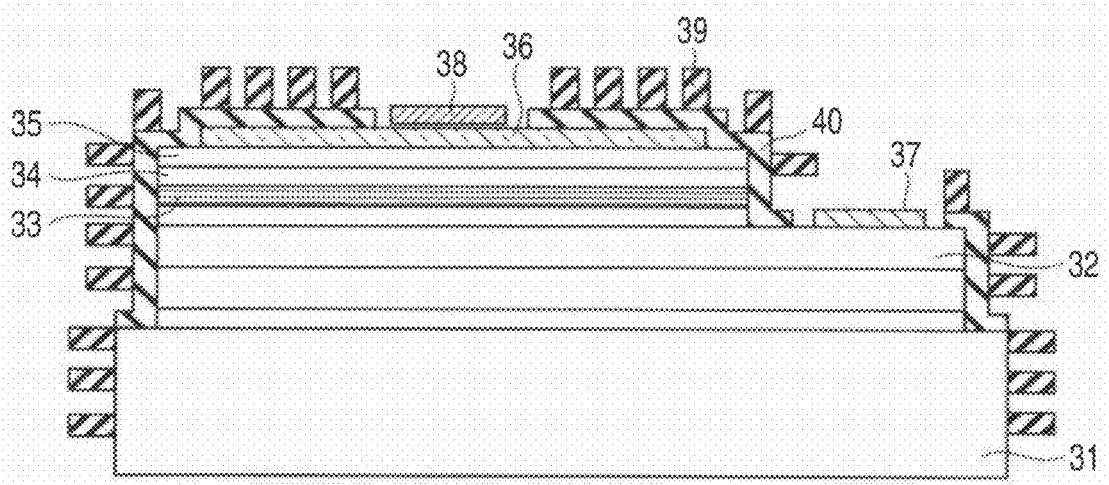
F I G. 14

US 8,148,890 B2

LIGHT-EMITTING DEVICE AND METHOD FOR MANUFACTURING THE SAME

CROSS-REFERENCE TO RELATED APPLICATIONS

This application is based upon and claims the benefit of priority from prior Japanese Patent Application No. 2007-216034, filed Aug. 22, 2007, the entire contents of which are incorporated herein by reference.

BACKGROUND OF THE INVENTION

1. Field of the Invention

The present invention relates to a light-emitting device in which light extraction efficiency is improved and a method for manufacturing the same.

2. Description of the Related Art

Recently, a semiconductor light-emitting device, especially a light-emitting diode (LED), is widely used in a backlight for a display, an in-vehicle device, an illumination device, and the like. A semiconductor light-emitting device having high luminous efficiency is demanded in such applications. The improvement of the light extraction efficiency of the device is one of promising measures for enhancing the luminous efficiency of the semiconductor light-emitting device. Therefore, research is being conducted on the improvement of light extraction efficiency.

For example, in the light-emitting device in which a substrate having a high refractive index is used, a light is reflected on a substrate surface and at an interface due to a large difference in refractive index with the outside, and some light component cannot be extracted to the outside because an output angle is not lower than the critical angle of total reflection. They cause a problem of a light extraction loss.

In a method of preventing the light extraction loss, there is known a technique of forming a high-refractive-index resin layer on the substrate surface or of performing a nanometer-scale irregularity surface treatment in order to obtain an anti-reflection effect or a diffraction effect.

However, in the conventional nanometer-scale irregularity surface treatment which is considered to efficiently extract the light emitted inside the light-emitting device to the outside (for example, see JP-A 2003-258296 and 2007-184313), since a complicated process such as etching is required to actually form the roughed surface, a theoretical optimum shape is hardly formed at an optimum position.

BRIEF SUMMARY OF THE INVENTION

According to a first aspect of the present invention, there is provided a light-emitting device comprising a support substrate which includes a light-emitting layer and a light extraction surface, and a light transmission layer, formed on the light extraction surface of the support substrate, having a periodic refractive index distribution structure in an in-plane direction and a thickness direction, the light transmission layer including a plurality of projections formed of a material having a refractive index lower than that of the support substrate.

According to a second aspect of the present invention, there is provided a method of manufacturing a light-emitting device, comprising forming a resin layer on a support substrate including a light-emitting layer formed of a material having a property in which the refractive index of the resin layer is changed by a phase transition of the resin layer, and the phase transition occurs by irradiating the resin layer with an energy beam; and irradiating the resin layer with the energy beam to produce the phase transition of the resin layer, thereby forming a periodic refractive index distribution structure in the resin layer.

BRIEF DESCRIPTION OF THE SEVERAL VIEWS OF THE DRAWING

FIG. 1 is a schematic view showing a light-emitting device according to a first embodiment of the invention;
FIG. 2 is a view explaining a light extraction mechanism of the light-emitting device of the first embodiment;
FIG. 13 is a schematic view showing the light-emitting device of Example 3;
FIG. 14 is a schematic view showing the modification of the light-emitting device of Example 3.

DETAILED DESCRIPTION OF THE INVENTION

Figure 3:
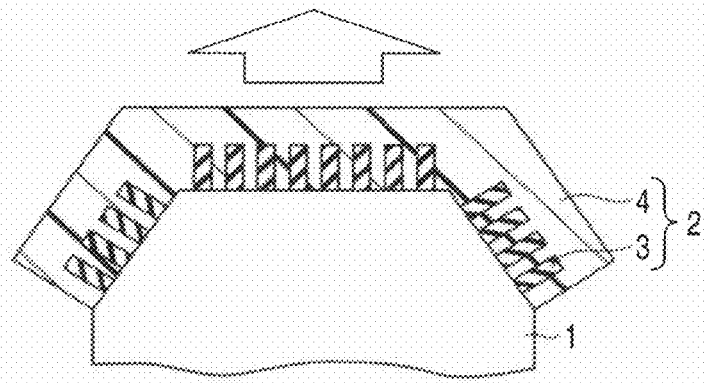
FIG. 3 is a schematic view showing a light-emitting device according to a second embodiment of the invention.

Various embodiments of the present invention will be described below.

FIG. 1 shows a light extraction surface of a light-emitting device according to a first embodiment of the invention. Referring to FIG. 1, a light transmission layer 2 is formed on a light output surface of an LED substrate 1 having an LED structure (not shown), and the light transmission layer 2 includes projections 3 and a resin layer 4. The projection 3 which acts as a high-refractive-index portion is made of an inorganic substance. The projection 3 is coated with the resin layer 4 which is of a low-refractive-index portion. It is only necessary that the projection 3 made of the inorganic substance have a periodic refractive index distribution structure. It is not always necessary to form the resin layer 4 which acts as a low-refractive-index portion, but an air layer may be used instead of the resin layer 4.

A semiconductor substrate such as silicon carbide (SiC), gallium nitride (GaN), and sapphire ($Al_2O_3$) can be used as the LED substrate 1.

The inorganic substance mainly containing a GaN or ZnO material can be used as the projection 3. The projection 3 made of the inorganic substance can be formed into a shape such as a nano-rod, a micro-rod, a nano-column, and a nano-whisker.

The projection 3 has a size, that is, a height and a diameter of the order of nanometers or sub-micrometers. The projection 3 having the size of the order of nanometers or sub-micrometers can be grown in a perpendicular direction from the substrate surface by depositing the projection 3 from a solution.

The resin layer as a low-refractive-index portion is made of various polymer materials such as a silicone resin, an acrylic resin, and an epoxy resin.

The light transmission layer 2 described above may be made of a material which has a high light transmittance for a light emission wavelength.

As shown in FIG. 1, an antireflection effect is obtained by forming the light transmission layer 2 on the light extraction surface of the LED substrate 1, and a diffraction effect is obtained by forming the periodic refractive index distribution structure including the projections 3 in the light transmission layer 2, so that efficiency of the light extraction from the high-refractive-index substrate 1 can be improved.

The effect of the first embodiment will be described with reference to FIG. 2.

Referring to FIG. 2, assuming that $n_1$ is the refractive index of the substrate 1, $n_2$ is the refractive index of the projection 3, and $n_3$ is the refractive index of the resin layer 4, the relationship $n_1 > n_2 > n_3$ holds. The light reaches the air from the light-emitting layer (not shown) through various paths, that is, mediums whose refractive indexes are sequentially decreased in a stepwise manner. For example, the light reaches the resin layer 4 having refractive index $n_3$ lower than refractive index $n_2$ from the substrate 1 having high refractive index $n_1$ through the projection 3 having low refractive index $n_2$.

As shown in FIG. 2, light A exiting in the perpendicular direction from the light extraction surface of the substrate 1 is transmitted through the projection 3 and the resin layer 4 without changing course, and light B which is directly and perpendicularly incident on the resin layer 4 from the light extraction surface of the substrate 1 is also transmitted through the resin layer 4.

Light C is incident on the projection 3 from the light extraction surface of the substrate 1 with an angle smaller than the critical angle, and light C is incident on an interface between the projection 3 and the resin layer 4 with an angle larger than the critical angle between the projection 3 and the resin layer 4. Then, light C is repeatedly totally reflected, and light C exits to the resin layer 4 from a top portion of the projection 3.

Light D is directly incident on the resin layer 4 from the light extraction surface of the substrate 1 with an angle larger than the critical angle between the substrate 1 and the resin layer 4, and light D is totally reflected and returned into the substrate 1. Light E is incident on the projection 3 from the light extraction surface of the substrate 1 with an angle smaller than the critical angle, and light E is incident on the interface between the projection 3 and the resin layer 4 with an angle smaller than the critical angle between the projection 3 and the resin layer 4. Then, light E is incident on the resin layer 4, and light E finally exits to the outside.

Thus, in the first embodiment, the difference in refractive index can be decreased in the light output surface by forming the projection 3 on the light output surface, so that the critical angle at which the total reflection of the light is produced can be increased in the light output surface compared with the case in which the light exits to the air. Therefore, the light extraction efficiency can be improved.

For example, an n-type GaN is used as the substrate 1, and ZnO columns are formed as the projection 3 on the light extraction surface of the substrate 1. In such cases, the critical angle in which the total reflection of the light is produced becomes 48.4°, which is much larger than the critical angle of 23.20 of the case in which the light exits to the air. Therefore, the light extraction efficiency can be improved four times the case in which the light exits to the air.

A blue-emitting LED is used as LED, and the projection 3 is made of a yellow fluorescent material, which allows white light to be extracted.

FIG. 3 shows a light extraction surface of a light-emitting device according to a second embodiment of the invention. Referring to FIG. 3, the light output surface of the LED substrate 1 having the LED structure (not shown) has a horizontal plane and inclined planes adjacent to the horizontal plane. The light transmission layer 2 including the projections 3 and the resin layer 4 is formed on the horizontal plane and the inclined planes.

Even if the light extraction surface has the inclined plane, the projection 3 can be formed perpendicular to the inclined plane. In the conventional light extraction surface structure in which the irregular surface is formed by etching, the irregular surface cannot be formed perpendicular to the inclined plane, but the irregular surface is formed perpendicular to the horizontal plane. Therefore, the projections 3 disturb the light output to degrade the light extraction efficiency. On the other hand, in the second embodiment, the projection 3 can be formed perpendicular to the light output surface, which allows the light extraction efficiency to be largely enhanced.

There is no particular limitation to an inclination angle of the inclined plane, but preferably the inclination angle ranges from 25° to 50°.

Figure 4:
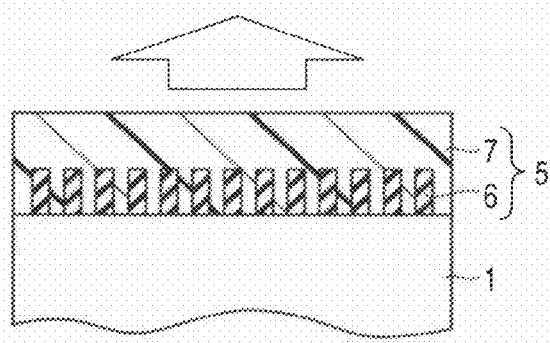
FIG. 4 is a schematic view showing a light-emitting device according to a third embodiment of the invention.

FIG. 4 shows a light extraction surface of a light-emitting device according to a third embodiment of the invention. Referring to FIG. 4, a light transmission layer 5 including a high-refractive-index portion 6 and a low-refractive-index portion 7 is formed on the light output surface of the LED substrate 1 having the LED structure (not shown).

The high-refractive-index portion 6 and the low-refractive-index portion 7 are made of resin materials, and an organic material layer is irradiated with an energy beam to produce a phase transition, thereby forming the periodic refractive index distribution structure including the high-refractive-index portion 6 and the low-refractive-index portion 7.

For example, a resin material for optical recording, a resin material for hologram recording, and a resin material for a diffraction grating optical component can be used as the organic material layer. After the resin layer is applied at a position, the phase transition occurs by irradiating the resin layer with the energy beam having a light intensity distribution, which allows the refractive index distribution to be formed. Depending on the material, the resin layer can be fixed by the subsequent thermal hardening.

A laser beam and an electron beam can be used as the energy beam.

In the third embodiment, because the refractive index distribution is formed in the layer according to the light intensity distribution, the light-emitting device is excellent for a control property such as a distribution interval and a position.

Figure 5:
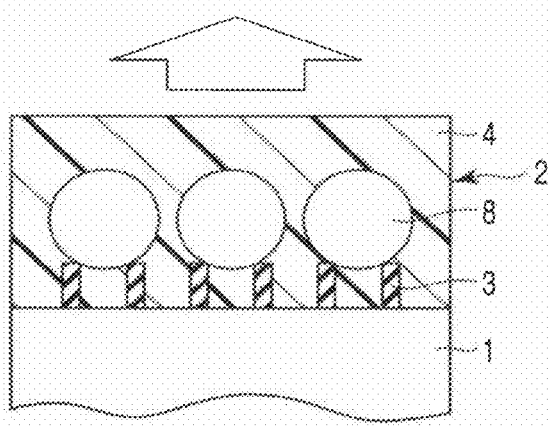
FIG. 5 is a schematic view showing a light-emitting device according to a fourth embodiment of the invention.

FIG. 5 shows a light extraction surface of a light-emitting device according to a fourth embodiment of the invention.

Referring to FIG. 5, similarly to the first embodiment shown in FIG. 1, the light transmission layer 2 including the projection 3 and the resin layer 4 is formed on the light output surface of the LED substrate 1 having the LED structure (not shown). In the fourth embodiment, fluorescent particles 8 are disposed on the projections 3 so as to close gaps between the projections 3. Preferably a particle diameter of the fluorescent particle 8 ranges from about 25 to about 70 nm.

Figure 6:
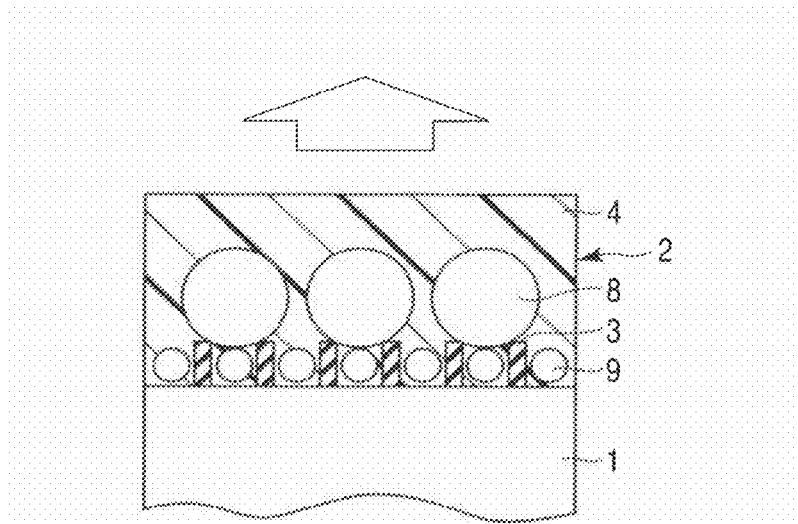
FIG. 6 is a schematic view showing a light-emitting device according to a fifth embodiment of the invention.

FIG. 6 shows a light extraction surface of a light-emitting device according to a fifth embodiment of the invention. Referring to FIG. 6, similarly to the fourth embodiment shown in FIG. 5, the light transmission layer 2 including the projection 3 and the resin layer 4 is formed on the light output surface of the LED substrate 1 having the LED structure (not shown), and the fluorescent particles 8 are disposed on the projections 3 so as to close gaps between the projections 3. In the fifth embodiment, small-diameter fluorescent particles 9 are accommodated in the gaps between the projections 3. Preferably a particle diameter of the fluorescent particle 9 ranges from about 10 to about 25 nm.

Figure 7:
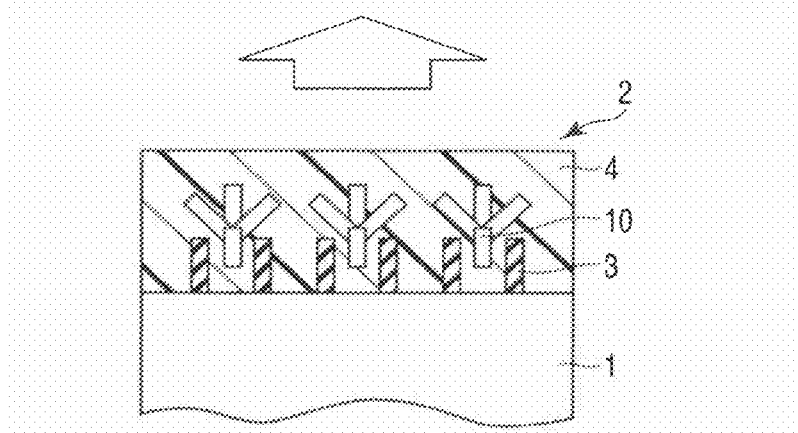
FIG. 7 is a schematic view showing a light-emitting device according to a sixth embodiment of the invention.

FIG. 7 shows a light extraction surface of a light-emitting device according to a sixth embodiment of the invention. Referring to FIG. 7, similarly to the first embodiment shown in FIG. 1, the light transmission layer 2 including the projection 3 and the resin layer 4 is formed on the light output surface of the LED substrate 1 having the LED structure (not shown).

In the sixth embodiment, nonspherical fluorescent materials 10 are disposed on the projections 3.

In the fourth to sixth embodiments, when the blue LED is used as LED, and the yellow fluorescent material is used as the fluorescent particles 8, 9, and 10, the white light can be extracted.

Examples of the invention will be described below.

EXAMPLE 1

Figure 8:
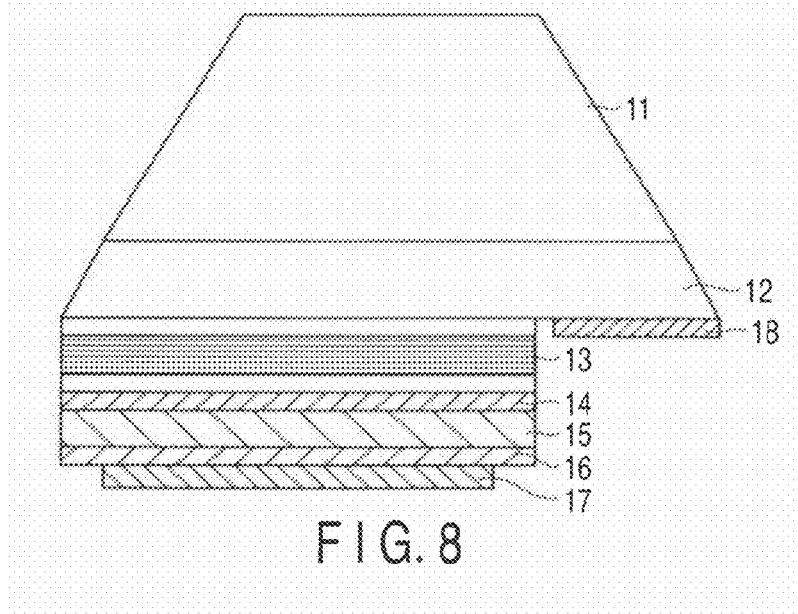
FIG. 8 is a schematic view showing a light-emitting device according to Example 1.

In a light-emitting diode shown in FIG. 8, an n-type GaN layer 12, an active layer 13, a p-type GaAlN layer (electron overflow prevention layer) 14, a first contact layer 15 made of a p-type GaN, and a second contact layer 16 made of a p-type GaN are sequentially formed on a substrate 11 made of GaN, SiC, or sapphire. Additionally, a p-type electrode layer 17 is formed on the second contact layer 16 made of the p-type GaN, and an n-type electrode layer 18 is formed on the n-type GaN layer 12.

The light-emitting diode of FIG. 8 is produced as follows.

First, the n-type GaN layer 12, in which an n-type impurity is doped, is formed on the substrate 11 by the crystal growth method. For example, metal organic chemical vapor deposition (MOCVD) can be used in the crystal growth method. In addition to MOCVD, molecular beam epitaxy (MBE) may be employed. Various elements such as Si and Ge can be used as the n-type impurity. In Example 1, Si is used as the n-type impurity. A Si doping amount can be set at about $2 \times 10^{18}$ cm$^{-3}$.

Next, the active layer 13 having a multiple quantum well (MQW) structure is formed on the n-type GaN layer 12. In the MQW structure, quantum well layers made of undoped In$_{0.2}$Ga$_{0.8}$N having thicknesses of about 3.5 nm and a barrier layer made of Si-doped In$_{0.01}$Ga$_{0.99}$N having a thickness of about 7 nm are alternately formed. In this step, a growth temperature ranges from 700 to 800° C.

Subsequently, Ga$_{0.8}$Al$_{0.2}$N having a thickness of about 10 nm in which a p-type impurity is doped is grown as the electron overflow prevention layer 14 on the active layer 13. Various elements such as Mg and Zn can be used as the p-type impurity. In Example 1, Mg is used as the p-type impurity. An Mg doping amount can be set at about $4 \times 10^{18}$ cm$^{-3}$.

After that, the first p-type contact layer 15 in which Mg is doped at about $1 \times 10^{19}$ cm$^{-3}$ is grown on the electron overflow prevention layer 14. The first p-type contact layer 15 has a thickness of about 50 nm.

Finally, the second p-type contact layer 16 having a thickness of about 20 nm in which Mg is doped at about $1 \times 10^{20}$ cm$^{-3}$ is grown on the p-type contact layer 15. The growth temperature ranges from 1000 to 1100° C. in the step for growing the electron overflow prevention layer 14 and the first and second p-type contact layers 15 and 16.

The following process for forming a device is performed to the wafer produced by the above-described crystal growth, thereby to finally prepare the light-emitting diode.

A resist is applied on the second p-type GaN contact layer 16, and an etching mask is formed by photolithography or electron-beam lithography. Then, a part of the second p-type GaN contact layer 16 is removed by dry etching until the n-type GaN layer 12 is exposed.

Next, a resist is applied on the second p-type GaN contact layer 16, and a resist mask having an opening pattern for forming an electrode is formed by the photolithography or electron-beam lithography. Then, the p-type electrode layer 17 formed by the electrode made of silver or an alloy containing silver is formed. A resist is applied, an opening pattern for forming the n-type electrode 18 is formed by the photolithography or electron-beam lithography, and the n-type electrode layer 18 including a composite film of titanium-platinum-gold (Ti/Pt/Au) is formed. The n-type electrode layer 18 includes a Ti film having a thickness of about 0.05 µm, a Pt film having a thickness of about 0.05 µm, and a Au film having a thickness of about 1.0 µm.

After that, the rear surface of the substrate 11 is polished to thin the wafer. At this point, the total thickness of the wafer is adjusted within a range of 100 to 350 µm. Then, V-grooves corresponding to the inclined planes of the side faces of the LED chip are formed into a lattice shape using a dicing machine. The inclination angle of the inclined plane is set within a range of 45 to 90 degrees. At this point, the inclination angle of the inclined plane can be controlled by an angle of a cutter edge of the dicing machine.

The wafer is dipped in an aqueous solution containing 0.02 mole/L zinc nitrate (Zn(NO$_3$)$_2$·6H$_2$) and 0.02 mole/L hexamethylenetetramine (C$_6$H$_{12}$N$_4$(HMT)), and the wafer is retained in the aqueous solution for one hour at a solution temperature of about 80° C.

Figure 9:
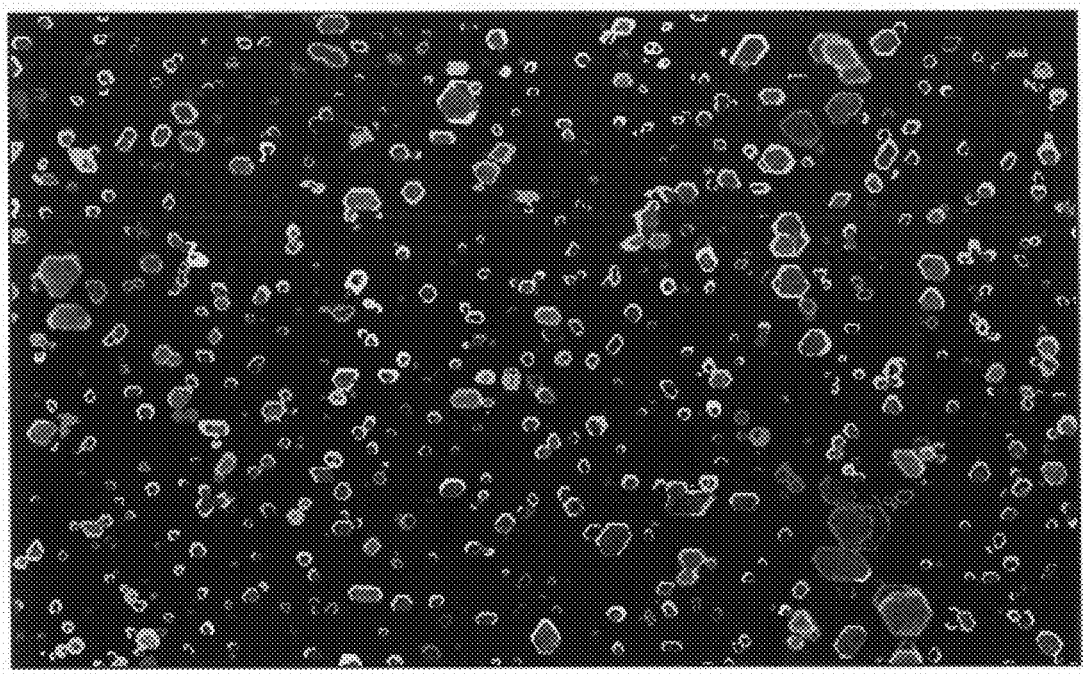
FIG. 9 is a view showing a ZnO hexagonal columnar crystal in the light-emitting device of Example 1.

Therefore, as shown in FIG. 9, the ZnO hexagonal columnar crystal can be grown perpendicular to the substrate surface, that is, the ZnO hexagonal columnar crystal can also be grown perpendicular to the inclined plane.

Figure 10:
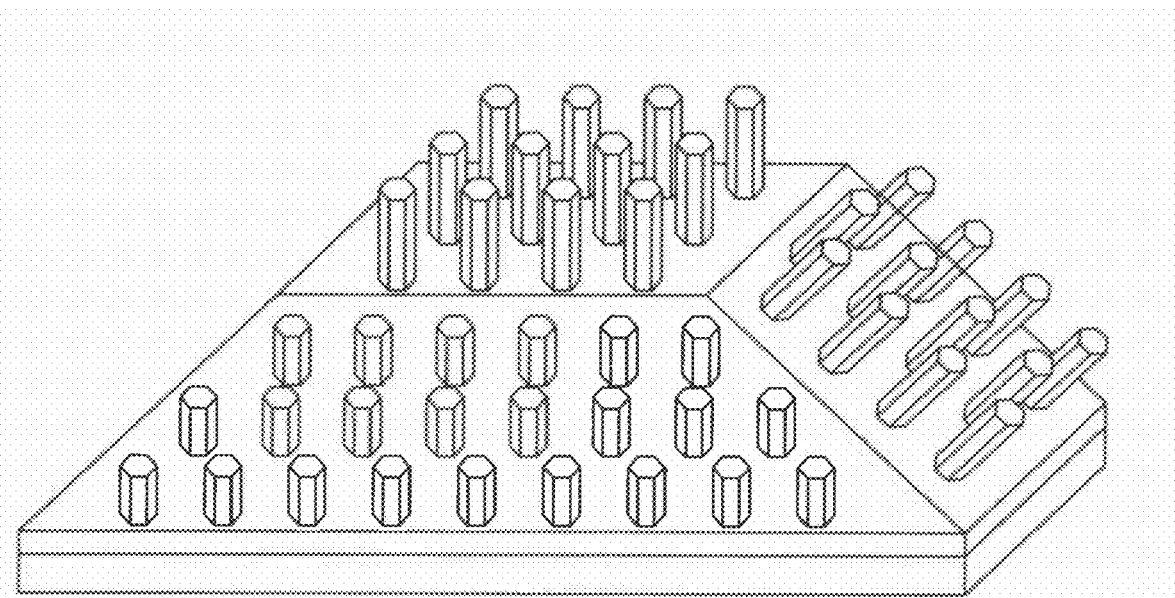
FIG. 10 is a schematic view showing a light extraction surface of the light-emitting device of Example 1.

Then, the wafer is separated into chips by breaking. One chip is formed into a square or rectangular shape in section, one side of which having a length of 200 to 1000 µm. Therefore, the device structure can be prepared as shown in FIG. 10. In the device structure, the ZnO hexagonal columnar crystal is grown perpendicular to the light output surfaces.

In the light-emitting device prepared in Example 1, the light extraction efficiency can be increased about four times the case in which the ZnO column is not formed.

EXAMPLE 2

Figure 11:
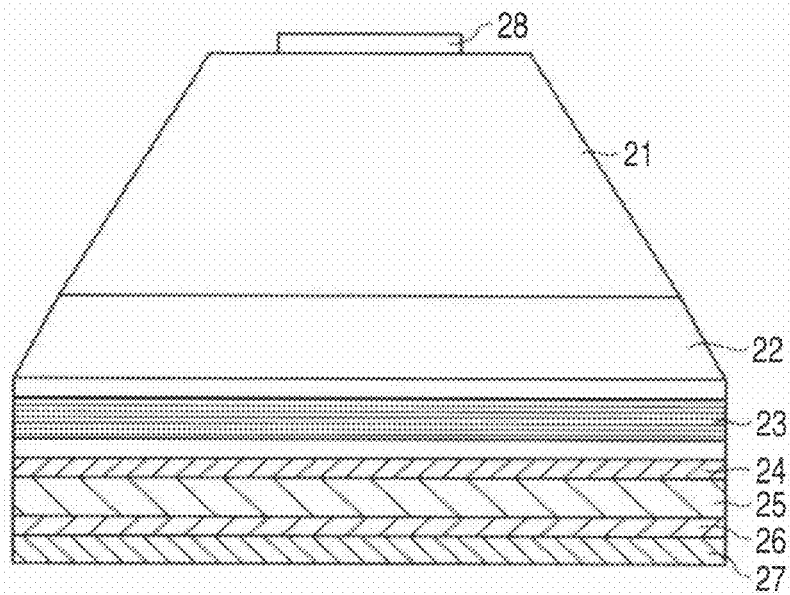
FIG. 11 is a schematic view showing the light-emitting device of Example 1.

As shown in FIG. 11, in a structure of a light-emitting diode of Example 2, electrodes are provided at the top and bottom of the substrate interposed therebetween, such that current flows in a vertical direction.

In the light-emitting diode shown in FIG. 11, an n-type GaN layer 22, an active layer 23, a p-type GaAlN layer (electron overflow prevention layer) 24, a first contact layer 25 made of a p-type GaN, and a second contact layer 26 made of a p-type GaN are sequentially formed on an n-type GaN substrate 21. Additionally, a p-type electrode layer 27 is formed on the second contact layer 26 made of the p-type GaN, and an n-type electrode layer 28 is formed on the n-type GaN layer 21.

The light-emitting diode of FIG. 11 structured as described above is produced as follows.

First, the n-type GaN layer 22, in which the n-type impurity is doped, is formed on the n-type GaN substrate 21 by crystal growth method. For example, metal organic chemical vapor deposition (MOCVD) can be used in the crystal growth method. In addition to MOCVD, molecular beam epitaxy (MBE) may be employed. Various elements such as Si and Ge can be used as the n-type impurity. In Example 2, Si is used as the n-type impurity. The Si doping amount can be set at about $2 \times 10^{18}$ cm$^{-3}$.

Next, the active layer 23 having the multiple quantum well (MQW) structure is formed on the n-type GaN layer 22. In the MQW structure, the quantum well layers made of undoped $In_{0.2}Ga_{0.8}N$ having thicknesses of about 3.5 nm and the barrier layer made of Si-doped $In_{0.01}Ga_{0.99}N$ having the thickness of about 7 nm are alternately formed. In this case, the growth temperature may range from 700 to 800° C.

Subsequently, $Ga_{0.8}Al_{0.2}N$ having a thickness of about 10 nm, in which the p-type impurity is doped, is grown to form the electron overflow prevention layer 24 on the active layer 23. Various elements such as Mg and Zn can be used as the p-type impurity. In Example 2, Mg may be used as the p-type impurity. The Mg doping amount can be set at about $4 \times 10^{18}$ cm$^{-3}$.

After that, the first p-type contact layer 25 in which Mg is doped at about $1 \times 10^{19}$ cm$^{-3}$ is formed on the electron overflow prevention layer 24 by the crystal growth method. The first p-type contact layer 25 has the thickness of about 50 nm.

Finally, the second p-type contact layer 26 having the thickness of about 60 nm, in which Mg is doped at about $1 \times 10^{20}$ cm$^{-3}$, is formed on the p-type contact layer 25 by the crystal growth method. The growth temperature may range from 1000 to 1100° C. in the crystal growth steps of electron overflow prevention layer 24 and the first and second p-type contact layers 25 and 26.

The following device process is performed to the wafer produced by the above-described crystal growth, thereby to prepare the light-emitting diode.

A resist is applied on the second p-type GaN contact layer 26, and the etching mask is formed by the photolithography or electron-beam lithography. Then, a part of the second p-type GaN contact layer 26 is removed by the dry etching until the n-type GaN layer 22 is exposed.

Next, a resist is applied on the second p-type GaN contact layer 26, and patterned to form a resist mask having an opening pattern for forming an electrode by the photolithography or electron-beam lithography. Then, the p-type electrode layer 27 made of silver or an alloy containing silver is formed.

Subsequently, the rear surface of the substrate 21 is polished to thin the thickness of the wafer. At this step, the total thickness of the wafer is adjusted within a range of 100 to 350 μm.

A resist is applied and patterned to form an opening pattern for forming the n-type electrode 28 by the photolithography or electron-beam lithography, and the n-type electrode layer 28 including the composite film of titanium-platinum-gold (Ti/Pt/Au) is formed. The n-type electrode layer 28 includes the Ti film having the thickness of about 0.05 μm, the Pt film having the thickness of about 0.05 μm, and the Au film having the thickness of about 1.0 μm.

Then, the V-grooves corresponding to the inclined planes of the side faces of the LED chip are formed into a lattice shape using a dicing machine. The inclination angle of the inclined plane is set within a range of 45 to 90 degrees. At this point, the inclination angle of the inclined plane can be controlled by an angle of a cutter edge of the dicing machine.

The wafer processed as described above is dipped in an aqueous solution containing 0.02 mole/L zinc nitrate ($Zn(NO_3)_2 \times 6H_2$) and 0.02 mole/L hexamethylenetetramine ($C_6H_{12}N_4$(HMT)), and the wafer is retained in the aqueous solution for one hour at a solution temperature of about 80° C.

Figure 12:
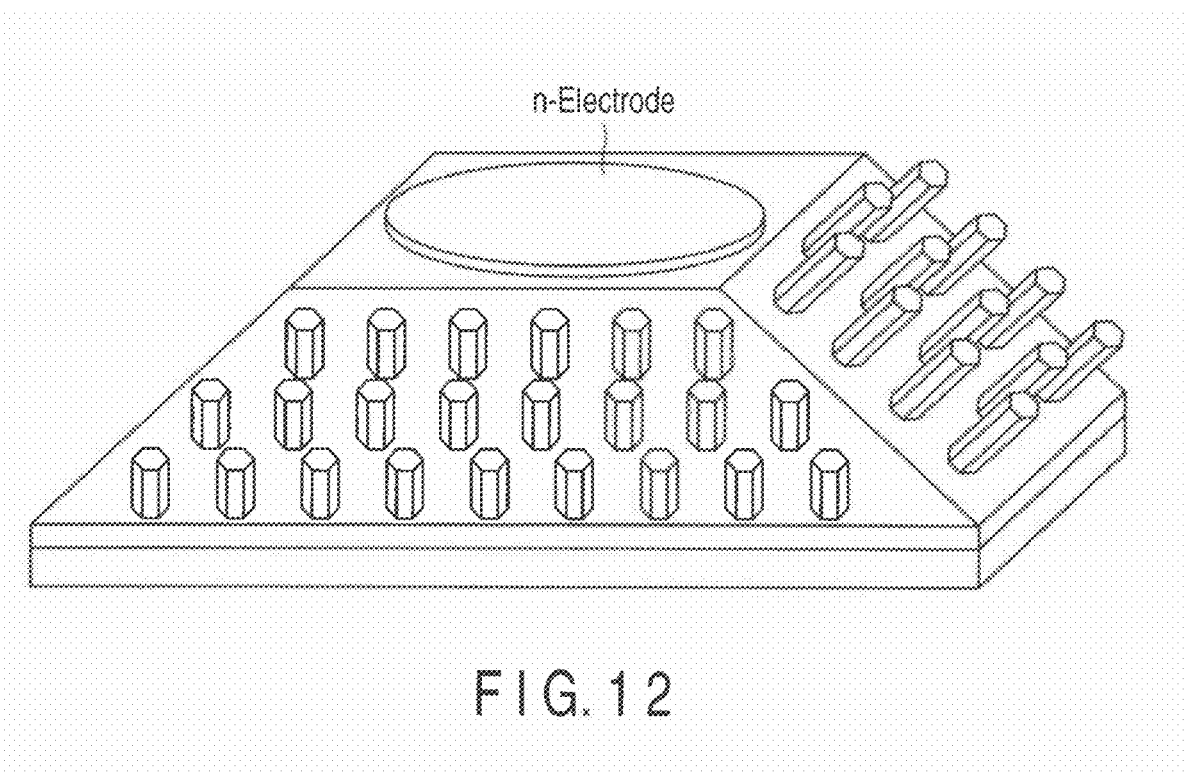
FIG. 12 is a schematic view showing a light extraction surface of a light-emitting device according to Example 2.

As a result, as shown in FIG. 12, the ZnO hexagonal columnar crystal can be grown perpendicular to the substrate surface. The ZnO hexagonal columnar crystal can also be grown perpendicular to the inclined plane.

Then, the wafer is separated into chips by breaking. One chip is formed into a square or rectangular shape in section, one side of which having a length of 200 to 1000 μm. Therefore, the device structure can be prepared as shown in FIG. 12. In the device structure, the ZnO hexagonal columnar crystal is grown perpendicular to the light output surfaces.

In the light-emitting device prepared in Example 2, the light extraction efficiency can be increased about four times the case in which the ZnO column is not formed.

EXAMPLE 3

As shown in FIG. 13, in a structure of a light-emitting diode of Example 3, a light is extracted through a transparent electrode.

In a light-emitting diode shown in FIG. 13, an n-type GaN layer 32, an active layer 33, a p-type GaAlN layer (electron overflow prevention layer) 34, a contact layer 35 made of a p-type GaN, and a transparent electrode 36 trough which a light emitted from the active layer 33 passes are sequentially formed on a substrate 31 made of GaN, SiC, or sapphire.

The light-emitting diode of FIG. 13 is manufactured as follows.

First, the n-type GaN layer 32, in which an n-type impurity is doped, is formed on the substrate 3 by a crystal growth method. For example, metal organic chemical vapor deposition (MOCVD) can be used as the crystal growth method. In addition to MOCVD, a molecular beam epitaxy (MBE) may be employed. Various elements such as Si and Ge can be used as the n-type impurity. In Example 3, Si is used as the n-type impurity.

Next, the active layer 33 having a multiple quantum well (MQW) structure is formed on the n-type GaN layer 32. In the MQW structure, quantum well layers made of undoped $In_{0.2}Ga_{0.8}N$ having thicknesses of about 3.5 nm and a barrier layer made of Si-doped $In_{0.01}Ga_{0.99}N$ having a thickness of about 7 nm are alternately laminated. In this step, a growth temperature ranges from 700 to 800° C.

Subsequently, $Ga_{0.8}Al_{0.2}N$ having a thickness of about 10 nm in which a p-type impurity is doped is grown as the electron overflow prevention layer 34 on the active layer 33. Various elements such as Mg and Zn can be used as the p-type impurity. In Example 3, Mg is used as the p-type impurity.

After that, the first p-type contact layer 35, in which Mg is doped, is grown on the electron overflow prevention layer 34. The first p-type contact layer 35 has a thickness of about 50 nm. The growth temperature for growing the electron overflow prevention layer 34 and the p-type contact layers 35 ranges from 1000 to 1100° C.

Then, the transparent layer 36, through which a light emitted from the active layer 33 is passed, is deposited on the p-type contact layers 35. The transparent layer 36 may be made of indium tin oxide (ITO), or ZnO. The transparent layer 36 may be formed by depositing ITO or ZnO on the p-type contact layers 35 by an electron beam evaporation apparatus or sputtering apparatus, and dry-etching or wet-etching the deposited film using a resist pattern as a mask.

Subsequently, a resist is applied on the p-type GaN contact layer 35 and transparent layer 36, and patterned to form an etching mask by photolithography or electron-beam lithography. Then, a part of the p-type GaN contact layer 35 is removed by dry etching until the n-type GaN contact layer 32 is exposed. And Ti/Al/Ni/Au films are deposited on the exposed n-type GaN contact layer 32 to form an n-side electrode 37.

Next, a resist is applied on the p-type GaN contact layer 35 and transparent layer 36, and is patterned to form a resist mask having an opening pattern for forming an electrode pad by the photolithography. Then, Ti/Pt/Au films are deposited to form a pad electrode 38.

A resist pattern is formed to cover the pad electrode 38 and n-side electrode 37. The wafer processed as described above is dipped in an aqueous solution containing 0.02 mole/L zinc nitrate ($Zn(NO_3)_2 \times 6H_2$) and 0.02 mole/L hexamethylenetetramine ($C_6H_{12}N_4$(HMT)), and the wafer is retained in the aqueous solution for one hour at a solution temperature of about 80° C.

As a result, as shown in FIG. 13, the ZnO hexagonal columnar crystal 39 can be grown perpendicular to the substrate surface.

Then, the wafer is separated into chips by breaking. One chip is formed into a square or rectangular shape in section, one side of which having a length of 200 to 1000 μm. In the device structure, the ZnO hexagonal columnar crystal is grown on the transparent electrode. Since the refractive index of the ITO film is about 2.12, and the refractive index of the ZnO hexagonal columnar crystal is about 1.95 which is between the refractive index of the ITO film and that of an air, the light extraction efficiency can be increased because the ZnO hexagonal columnar crystal is formed on the ITO film.

FIG. 14 shows the modification of Example 3. In the structure shown in FIG. 14, the other portions of the structure than the p-side electrode pad and n-side electrode are covered with an insulating oxide 40 on which the ZnO hexagonal columnar crystal is formed. In this structure, even if a light emits from the side of the wafer, the light extraction efficiency can be increased, and a high light output can be obtained.

EXAMPLE 4

Figure 15:
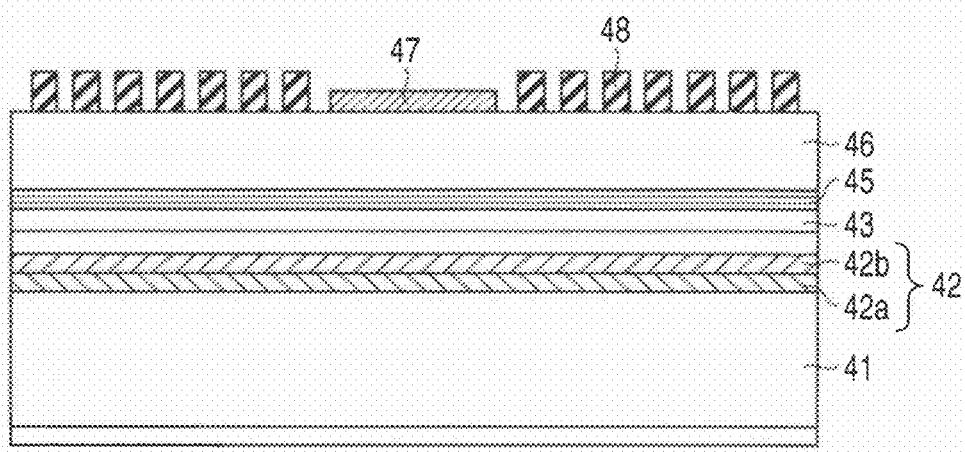
FIG. 15 is a schematic view showing the light-emitting device of Example 4.

FIG. 15 shows a structure of a light-emitting diode of Example 4.

In a light-emitting diode shown in FIG. 15, a bonded part 42 includes a p-type high reflection electrode through a bonding metal on a supporting substrate 41 made of Si, Ge, SiC, ZnO, or CuW. Further, a p-type GaN contact layer 43, a p-type GaAlN layer (electron overflow prevention layer) 44, an active layer 45, n-type GaN contact layer 46, and a n-side electrode are sequentially formed on the supporting substrate 41. A ZnO hexagonal columnar crystal 47 is formed on the n-type GaN contact layer 46.

The light-emitting diode of FIG. 15 is manufactured as follows.

First, the n-type GaN layer 42, in which an n-type impurity is doped, is formed on a sapphire substrate (not shown) through a buffer layer by a crystal growth method. Various elements such as Si and Ge can be used as the n-type impurity. In Example 3, Si is used as the n-type impurity. For example, metal organic chemical vapor deposition (MOCVD) can be used as the crystal growth method. In addition to MOCVD, a molecular beam epitaxy (MBE) may be employed.

Next, the active layer 45 having a multiple quantum well (MQW) structure is formed on the n-type GaN layer 46. In the MQW structure, quantum well layers made of undoped $In_{0.2}Ga_{0.8}N$ and a barrier layer made of Si-doped $In_{0.01}Ga_{0.99}N$ are alternately laminated. In this step, a growth temperature ranges from 700 to 800° C.

Subsequently, $Ga_{0.8}Al_{0.2}N$ having a thickness of about 10 nm in which a p-type impurity is doped is grown as the electron overflow prevention layer 44 on the active layer 45. Various elements such as Mg and Zn can be used as the p-type impurity. In Example 4, Mg is used as the p-type impurity.

After that, the p-type contact layer 43, in which Mg is doped, is grown on the electron overflow prevention layer 44. The p-type contact layer 43 has a thickness of about 50 nm. The growth temperature for growing the electron overflow prevention layer 44 and the p-type contact layers 43 ranges from 1000 to 1100° C.

Then, the high reflection electrode 42b and bonding metal 42a are sequentially deposited on the p-type GaN contact layer 43. The high reflection electrode 42b may be made of a material having a high reflectivity such as Ag or Pt. The bonding metal 42a may be made of Sn containing alloy or Au.

Subsequently, the resultant structure is bonded to the supporting substrate 41 through the bonding metal 42a. Thermal bonding or supersonic bonding may be employed as the bonding method.

And then, a laser having a wavelength of 355 nm is irradiated onto the rear surface of the sapphire substrate to modify the interface between the sapphire substrate and the buffer layer, thus removing the sapphire substrate.

That surface of the resultant structure, from which the sapphire substrate is removed, is subjected to dry etching or polishing to expose the n-type GaN contact layer 46. And Ti/Al/Ni/Au films are deposited on the exposed n-type GaN contact layer 46 to form an n-side electrode 47.

Next, a resist is applied on the entire surface of the resultant structure, and is patterned to form a resist mask covering the n-type GaN contact layer 46.

The wafer processed as described above is dipped in an aqueous solution containing 0.02 mole/L zinc nitrate ($Zn(NO_3)_2 \times 6H_2$) and 0.02 mole/L hexamethylenetetramine ($C_6H_{12}N_4$(HMT)), and the wafer is retained in the aqueous solution for one hour at a solution temperature of about 80° C.

As a result, as shown in FIG. 15, the ZnO hexagonal columnar crystal 48 can be grown perpendicular to the n-type GaN contact layer 46.

Then, the wafer is separated into chips by breaking. One chip is formed into a square or rectangular shape in section, one side of which having a length of 200 to 1000 μm. In the device structure, since the ZnO hexagonal columnar crystal is grown on the n-type GaN contact layer 46, the light extraction efficiency can be increased.

Figure 16:
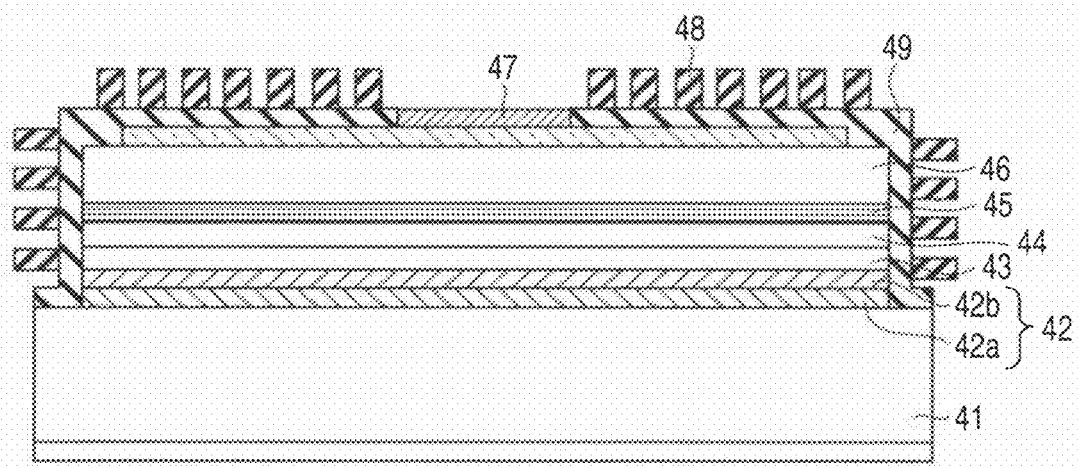
FIG. 16 is a schematic view showing the modification of the light-emitting device of Example 4.

FIG. 16 shows the modification of Example 4. In the structure shown in FIG. 16, the other portions of the structure than the n-side electrode 47 are covered with an insulating oxide 49 on which the ZnO hexagonal columnar crystal 48 is formed. In this structure, even if a light emits from the side of the wafer, the light extraction efficiency can be increased, and a high light output can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light-emitting device comprising:
a support substrate which includes a light-emitting layer and a light extraction surface; and
a light transmission layer, formed on the light extraction surface of the support substrate, having a periodic refractive index distribution structure in an in-plane direction and a thickness direction, the light transmission layer including a plurality of projections formed of a material having a refractive index lower than that of the support substrate,
wherein first fluorescent particles are disposed on the projections so as to close gaps between the projections, and second fluorescent particles having a particle diameter smaller than that of the first fluorescent particles are disposed in gaps between projections adjacent to each other.

2. The device according to claim 1, wherein the support substrate is formed of a material selected from the group consisting of silicon carbide, gallium nitride, and sapphire.

3. The device according to claim 1, wherein the light transmission layer further includes a coating layer formed of a material having a refractive index lower than that of the projection coated with the coating layer.

4. The device according to claim 3, wherein the projection is formed of an inorganic material, and the coating layer is formed of a resin material.

5. The device according to claim 3, wherein the projection mainly contains a GaN or ZnO material, and the coating layer is formed of a material selected from the group consisting of a silicone resin, acrylic resin, and epoxy resin.

6. The device according to claim 1, wherein the projection is formed of a fluorescent material.

7. The device according to claim 3, wherein the projection and the coating layer are formed of a resin material, and the projection is formed by a phase transition of a resin, the phase transition of the resin being produced by irradiating the resin with an energy beam.

8. The device according to claim 1, wherein the light extraction surface of the support substrate includes a horizontal plane and inclined planes adjacent to the horizontal plane.

9. The device according to claim 8, wherein an inclination angle of the inclined planes ranges from about 25° to about 50°.

10. The device according to claim 1, wherein the projection has a size of the order of nanometers or sub-micrometers.

11. The device according to claim 1, wherein the support substrate further includes a transparent electrode from which a light is extracted and on which the light transmission layer is formed.

12. The device according to claim 11, wherein an insulating oxide layer is formed on the transparent electrode and on the side surface of the support substrate, and the light transmission layer is formed on the insulating oxide layer.

* * * * *